United States Patent
Fiebag

(12) 
(10) Patent No.: US 6,660,454 B2
(45) Date of Patent: Dec. 9, 2003

(54) ADDITIVE COMPOSITION FOR BOTH RINSE WATER RECYCLING IN WATER RECYCLING SYSTEMS AND SIMULTANEOUS SURFACE TREATMENT OF LITHOGRAPHIC PRINTING PLATES

(75) Inventor: Ulrich Fiebag, Nienstaedt (DE)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 10/272,762

(22) Filed: Oct. 17, 2002

(65) Prior Publication Data

US 2003/0073012 A1 Apr. 17, 2003

Related U.S. Application Data

(62) Division of application No. 09/861,126, filed on May 18, 2001, now abandoned.

(51) Int. Cl.$^7$ ................................................ G03F 7/40
(52) U.S. Cl. ...................................... 430/292; 430/302
(58) Field of Search ................................ 430/292, 302

(56) References Cited

U.S. PATENT DOCUMENTS

| | | | |
|---|---|---|---|
| 3,627,685 A | 12/1971 | Lam ........................... | 252/100 |
| 4,686,260 A | 8/1987 | Lindemann et al. ........ | 523/222 |
| 5,064,749 A | 11/1991 | Matsumoto et al. ......... | 106/2 |
| 6,410,498 B1 | 6/2002 | Smets et al. ............... | 424/94.5 |

FOREIGN PATENT DOCUMENTS

| | | |
|---|---|---|
| EP | 0111136 | 10/1983 |
| EP | 0220662 | 10/1986 |
| EP | 0336673 | 4/1989 |
| EP | 0397407 | 5/1990 |
| EP | 0411883 | 7/1990 |
| EP | 0441502 | 1/1991 |
| GB | 1542800 | 12/1977 |

Primary Examiner—Hoa Van Le
(74) Attorney, Agent, or Firm—RatnerPrestia

(57) ABSTRACT

Additive compositions suitable for rinse water used for processing lithographic printing plates, particularly to additive compositions for rinse water in water recycling systems, are disclosed. The additive compositions contain at least one water-soluble film-forming polymer; optionally, at least one pH regulating agent capable of maintaining the pH value of an aqueous solution at about 7 or below; and at least one compound selected from the group consisting of phosphonic acid derivatives of formula I.

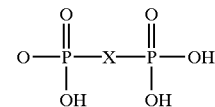

in which X is $C_2$–$C_6$ alkylene or

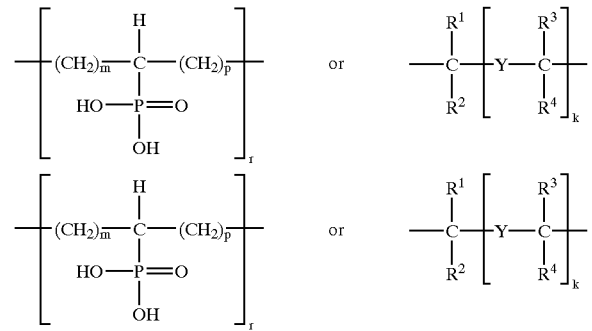

in which: k is 0 or 1; m is 1, 2, or 3; p is 1, 2, or 3; r is an integer from 10 to 20; $R^1$ and $R^3$ are each independently H or $C_1$–$C_4$ alkyl; $R^2$ and $R^4$ are each independently H, OH or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—$P(O)(OH)_2$.

30 Claims, No Drawings

ADDITIVE COMPOSITION FOR BOTH RINSE WATER RECYCLING IN WATER RECYCLING SYSTEMS AND SIMULTANEOUS SURFACE TREATMENT OF LITHOGRAPHIC PRINTING PLATES

This application is a divisional application of U.S. application Ser. No. 09/861,126, filed May 18, 2001 now ABN incorporated herein by reference.

FIELD OF THE INVENTION

The invention relates to additive compositions suitable for rinse water used for processing lithographic printing plates, particularly to additive compositions for rinse water in water recycling systems. Further, the invention refers to aqueous concentrates of said additive compositions, to a method of processing an imagewise exposed lithographic printing plate by using rinse water containing said additive composition, and to printing plates obtained by said method.

BACKGROUND OF THE INVENTION

The art of lithographic printing is based upon the immiscibility of oil and water, in which oily material or ink is preferentially retained by the image areas and the water or fountain solution is preferentially retained by the non-image areas of the printing plate. When a suitably prepared surface is moistened with water and ink is applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket, which in turn transfers the ink to the surface of the material upon which the image is to be reproduced.

Lithographic printing plates can be either negative-working or positive-working, and comprise one or more radiation-sensitive layers on a suitable substrate, such as metal or polymeric support. The radiation-sensitive layer generally includes one or more radiation-sensitive components that may be dispersed in a suitable binder. Alternatively, the radiation-sensitive component can also be the binder material. Certain useful printing plates can be used either as positive-working or negative-working.

A negative-working printing plate generally has a light sensitive layer composed of a radiation-sensitive component such as an unsaturated resin on a suitable substrate. Upon imagewise exposure to light, the exposed areas are hardened, leaving non-exposed areas removable during development. Certain negative-working printing plates contain novolac resins, a cross-linking agent, and a radiation-sensitive component that produces acid on exposure. By subsequently heating the plate, only the exposed areas are cured and the unexposed areas can be removed by a developer. The exposed, hardened areas are therefore oleophilic and will accept ink while the non-exposed underlying areas of the substrate are hydrophilic.

An alkaline developable positive-working printing plate generally has a light sensitive layer comprising a novolac resin and a radiation-sensitive component such as an o-diazoquinone or diazonaphthoquinone compound. Upon imagewise exposure to imaging radiation, the radiation-sensitive component is converted to the corresponding carboxylic acid. The use of an alkaline developer will remove only the exposed areas of the radiation-sensitive layer, leaving the surface of the support. Because the surface of the support is hydrophilic, the uncovered non-image area attracts water and repels the oily ink. The image area remaining after development is oleophilic thereby repelling water and attracting the printing ink.

After subjecting the imagewise exposed printing plate to a suitable developer solution the plate is rinsed with water ("rinse water") in order to remove the developer solution adhering thereto. Subsequently, the plate is usually subjected to a gumming step in order to protect the plate against air and pollution during storage before being used for printing.

The rinsing of the plate with fresh water results in a high consumption of water. In addition to the high costs for the fresh water, there is an additional high cost for waste-water treatment, because a large amount of waste water contaminated with both the organic substances of the radiation-sensitive layer and the ingredients of the used developer has to be treated. Therefore, there is a tendency to use a water recycling system in order to save water and costs. This means that the printing plates are no longer rinsed with fresh water (like tap water and well water) but with water that is permanently in circulation. However, due to the permanent recycling the water quality decreases by the uptake of developer solution and coating components during the rinsing step; consequently the rinsing efficiency decreases and the image and non-image areas of the plate might be interfered.

Furthermore, it is time consuming to carry out the rinsing and gumming subsequently in separate process steps. Therefore, it would be desirable to overcome the necessity of a separate gumming step.

Therefore, a need exists for a method of processing an imagewise exposed printing plate in which the rinse water can be recirculated without a decrease of rinsing efficiency, which does not require of a separate gumming step, and which can be carried out by the use of conventional processors, i.e. which does not require new and/or additional equipment.

SUMMARY OF THE INVENTION

The invention is an additive composition that can be added to the rinse water used to rinse an imagewise exposed and developed lithographic printing plate (also known as a printing plate precursor), an aqueous concentrate comprising the additive composition, a rinse water, a method of for processing an imagewise exposed lithographic printing plate using the rinse water, and an exposed and developed lithographic printing plate (also called a printing form) produced by the method of the invention. The additive composition comprises:

(a) at least one water-soluble film-forming polymer; and
(b) at least one compound selected from the group consisting of phosphonic acid derivatives of formula I

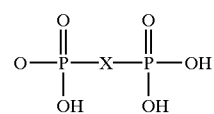

in which X is $C_2$–$C_6$ alkylene or

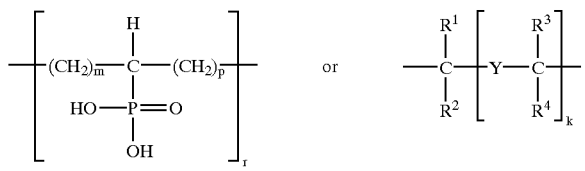

in which: k is 0 or 1; m is 1, 2, or 3; p is 1, 2, or 3; r is an integer from 10 to 20; $R^1$ and $R^3$ are each independently H or $C_1$–$C_4$ alkyl; $R^2$ and $R^4$ are each independently H, OH or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—P(O)(OH)$_2$. Preferably, the additive composition further comprises at least one pH regulating agent capable of maintaining the pH value of an aqueous solution at about 7 or below.

DETAILED DESCRIPTION OF THE INVENTION

One essential component of the additive composition is at least one film-forming water-soluble polymer. Typical examples of such polymers include natural substances and modified products thereof like gum arabic, starch derivatives, for instance, dextrin, wasted dextrine, enzyme-modified dextrin, etherified enzyme-modified dextrin, carboxymethylated starch and starch phosphate, octenyl succinated starch, alginates or cellulose derivatives, for instance, carboxymethyl cellulose, carboxyethyl cellulose, hydroxyethyl cellulose, methyl cellulose and hydroxypropyl methyl cellulose; and synthetic substances like polyvinyl alcohol and derivatives thereof, polyvinyl pyrrolidone, polyacrylamide and copolymers thereof, polyacrylic acid and copolymers thereof, styrene/maleic anhydride copolymers, vinyl methyl ether/maleic anhydride copolymer and vinyl acetate/maleic anhydride copolymers. These water-soluble polymers may be used alone or in combination and the amount thereof in the additive composition of the invention preferably ranges from about 0.1 to 80% by weight, more preferably about 5 to 30% by weight on the basis of the total amount of additives.

Another essential component of the additive composition is at least one component selected from the group consisting of phosphonic acid derivatives of formula I

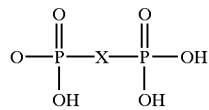

in which X is $C_2$–$C_6$ alkylene or

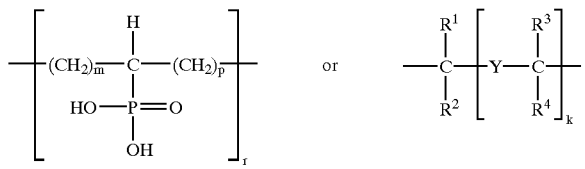

in which: k is 0 or 1; m is 1, 2, or 3; p is 1, 2, or 3; r is an integer from 10 to 20; $R^1$ and $R^3$ are each independently H or $C_1$–$C_4$ alkyl; $R^2$ and $R^4$ are each independently H, OH or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—P(O)(OH)$_2$.

As used herein the terms "alkyl", "alkylene" and "alkoxy" include both straight-chain and branched-chain groups.

Preferred additive compositions comprises hydroxyethanediphosphonic acid or suitable salts thereof, hexamethylenediamino-tetra(methylenephosphonic acid) or suitable salts thereof, aminotri(methyl-enephosphonic acid) or suitable salts thereof, as phosphonic acid derivative of formula I. Sodium salts thereof are especially preferred. Besides single compounds, mixtures of two or more thereof can be used.

The amount of the at least one phosphonic acid derivative is not limited, but in preferred embodiments the amount is from about 0.1 to 30 wt %, especially preferred is from about 3 to 20 wt %, based on the total amount of additives.

The additive composition of the invention preferably contains a pH regulating agent, or buffer, capable of maintaining the pH of an aqueous solution at about pH 7 or below (preferably in the range of about pH 5 to pH 6), i.e. capable of compensating hydroxide ions from the alkali developer. Suitable pH regulating agents comprise, for example, citric acid, citrates (citric acid salts, preferably alkali metal salts of citric acid), boric acid, acetic acid, propionic acid, succinic acid, phosphates, phosphoric acid and aminotris-(methylene-phosphonic acid). They are preferably used in a concentration of about 0.01 to 1 mol per 100 g additive composition, more preferably about 0.01 to 0.5 mol. The pH regulating agent should be capable of keeping the pH of an aqueous composition at about 7 or below as long as possible when hydroxide ions are added.

The term "water" as used herein includes tap water, well water, demineralized (deionized) water and recirculated rinse water, unless defined otherwise.

The additive composition of the invention optionally comprises at least one further additive selected from the group consisting of antifoaming agents, biocides, corrosion inhibitors, chelating agents and surfactants.

Suitable antifoaming agents are for instance Silicone Antifoam emulsion SE57 (Wacker), TRITON® CF32 (Rohm & Haas), AKYPO® LF2 (ether carbonic acid, Chem Y), Agitan 190 (Münzing Chemie), TEGO® Foamese 825 (modified polysiloxane, TEGO Chemie Service GmbH, DE). Silicone-based antifoaming agents are preferred. They can be either emulsion-dispersible or soluble in water. Preferably, the amount of silicon-based antifoaming agents is about 0.005 to 5 wt % based on the total amount of additives; more preferably about 0.005 to 1 wt %. The amount of other antifoaming agents is preferably about 0.1 to 5 wt %, more preferably about 0.5 to 3 wt % based on the total amount of additives. It is possible to use a single antifoaming agent or a combination of two or more thereof.

The biocide should be effective against bacteria, fungi and/or yeasts. Suitable biocides are N-methylol-chloroacetamide, benzoic acid, phenol or its derivatives, formalin, imidazole derivatives, sodium dehydro-acetate, isothiazolinone derivatives, benzotriazole derivatives, amidines, guanidine derivatives, quaternary ammonium salts, pyridine, quinoline derivatives, diazine, triazole derivatives, oxazoles and oxazine derivatives, and mixtures thereof. Although their amount varies depending on the kind of bacteria, fungi and/or yeasts, it is preferably about 1 to 80 wt % based on the total amount of additives, more preferably about 30 to 80 wt %. It is possible to use a single biocide or a mixture of two or more.

Suitable examples of corrosion inhibitors are magnesium nitrate, zinc nitrate, calcium nitrate, sodium nitrate, potassium nitrate, lithium nitrate, ammonium nitrate and mixtures thereof. Typically they are used in an amount of about 0.5 to 10 wt % based on the total amount of additives, more preferably about 1 to 5 wt %. The inhibitors can be used individually or as a mixture of two or more thereof.

Examples of suitable chelating agents include aminopolycarboxylic acid and salts thereof such as ethylenediamine-tetraacetic acid and potassium or sodium salt thereof, diethylenetriamine-pentaacetic acid and potassium or sodium salt thereof, triethylenetetramine-hexaacetic acid and potassium or sodium salt thereof, hydroxyethyl ethylenediamine-triacetic acid and potassium or sodium salt thereof, nitrilotriacetic acid and potassium or sodium salt thereof, 1,2-diaminocyclohexane-tetraacetic acid and potassium or sodium salt thereof and 1,3-diamino-2-propanol tetraacetic acid and potassium or sodium salt thereof; and an organophosphonic acid, phosphonoalkane tricarboxylic acid or salts thereof such as 2-phosphonobutanetricarboxylic acid-1,2,4 and potassium or sodium salt thereof, 2-phosphonobutane-tricarboxylic acid-2,3,4 and potassium or sodium salt thereof, 1-phosphonoethane-tricarboxylic acid-2,2,2 and potassium or sodium salt thereof, aminotris-(methylene-phosphonic acid) and potassium or sodium salt thereof and sodium gluconate; the chelating agents can be used singly or in combination of two or more thereof. Organic amine salts of the foregoing chelating agents may be used effectively instead of potassium and sodium salts thereof. These chelating agents are preferably used in an amount ranging from about 0.1 to 30% by weight, more preferably about 3 to 10% by weight on the basis of the total amount of additives. Since the phosphonic acid derivatives of formula I are able to form a complex with for instance magnesium and calcium ions it is not necessary to use one of the chelating agents above. However, depending on for instance the hardness of the rinse water to which the additive composition is added, it might be advantageous to use a chelating agent in addition to the phosphonic acid derivatives of formula I.

Suitable surfactants include anionic surfactants like fatty acid salts, abietic acid salts, hydroxyalkanesulfonic acid salts, dialkyl sulfosuccinate salts, alkyl naphthalene-sulfonate salts, alkyl-phenoxy polyoxyethylenepropylsul-fonate salts, polyoxyethylene alkylsulfophenyl ether salts, sodium salt of N-methyl-N-oleyltaurine, disodium salt of N-alkylsulfosuccinic acid amide, petroleum sulfonic acid salts, sulfated castor oil, sulfated tallow, sulfuric acid ester salts of fatty acid alkyl esters, alkylsulfate ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphate ester salts, polyoxyethylene alkyl ether phosphoric acid ester salts, polyoxyethylene alkylphenyl ether phosphoric acid ester salts, partially saponified styrene-maleic anhydride copolymers, partially saponified olefin-maleic anhydride copolymers and condensates of naphthalene sulfonic acid salt and formalin; alkylbenzene sulfonates, alkane sulfonates, alkylsulfates and alkylethersulfates, nonionic surfactants like glycerin, ethylene glycol, triethylene glycol, sorbitan fatty acid ester, alkyl phenolethoxylates, fatty alcohol ethoxylates, alkyl polyglucosides and N-methylglucamides; and cationic surfactants like quaternary ammonium compounds with one or two hydrophobic groups and salts of long chain primary amines.

The surfactants are preferably used in an amount of about 0.5 to 50 wt % based on the total amount of additives, more preferably about 5 to 20 wt %. Besides the use of a single surfactant, it is also possible to use a combination of two or more thereof.

Depending on the particular components used for the additive composition and their amounts the composition can for instance be formulated as powder, tablet, paste, emulsion, suspension or solution.

Furthermore, the additive composition can be incorporated into water in order to obtain an aqueous concentrate thereof. Preferably the amount of additive composition incorporated is about 40 to 90 wt % based on the amount of water used, more preferably about 50 to 80 wt %.

The invention also relates to a method for processing an imagewise exposed lithographic printing plate. Said method comprises
(i) applying a developer to the exposed plate and
(ii) rinsing the plate thereafter with water (so called rinse water) which contains the additive composition according to the invention The method can be used for processing any positive or negative working lithographic printing plate that is developed by means of a developer solution.

The developer can be any developer useful for removing the non-image areas of an imagewise exposed plate.

The developer can be any developer useful for removing the non-image areas of an imagewise exposed plate. Depending on the kind of plate (i.e. the ingredients of the radiation-sensitive composition) a person skilled in the art is able to select a suitable developer for the imagewise exposed plate. Alkaline developers are disclosed, for example, in Yamasue, U.S. Pat. No. 4,259,434; Miller, U.S. Pat. No. 5,851,735; Hall, U.S. Pat. No. 5,122,243; West, U.S. Pat. No. 5,368,974; and Fiebag, U.S. Pat. No. 6,143,479.

The amount of additive composition and aqueous concentrate, respectively added to the rinse water depends on the $m^2$ plates to be rinsed and the type of plate. The amounts of components given below are suitable for most applications.

It is preferred that the rinse water used in the method according to the invention comprises about 0.0004 to 8 wt % based on the rinse water of the at least one film-forming polymer, more preferably about 0.02 to 4 wt %, most preferably about 0.25 to 1.5 wt %.

Concerning the pH regulating agent, it is preferred to use about 1 to 100 mmole/L of rinse water, more preferably about 1 to 50 mmole/L. The pH of the recirculated rinse water should be kept at about 7 or below as long as possible. The rinse water can, however, still be used for processing when the pH is above 7 as long as the pH is not higher than about 9.5.

At least one phosphonic acid derivative is preferably present in an amount of about 0.0004 to 3 wt % based on the rinse water, more preferably about 0.01 to 2 wt %, most preferably about 0.15 to 0.8 wt %.

The rinse water can optionally contain about 0 to 0.5 wt %, based on the amount of rinse water, of antifoaming agent, more preferably the amount is about 0.00002 to 0.1 wt % for silicone-based agents and about 0.0002 to 0.3 wt % for other antifoaming agents.

For inhibiting the growth of bacteria, fungi, yeast and algae it is preferred to use about 0 to 8 wt %, based on the amount of rinse water, of at least one biocide, more preferably about 0.12 to 8 wt %, most preferably about 1.5 to 5 wt %.

At least one corrosion inhibitor is preferably present in an amount of about 0 to 2 wt %, based on the amount of rinse water, more preferably about 0.004 to 0.5 wt %, most preferably about 0.1 to 0.5 wt %.

Concerning the chelating agent, it is preferred to use about 0 to 3 wt % based on the rinse water, more preferably about 0.01 to 1 wt %, most preferably about 0.05 to 0.5 wt %.

It is preferred that the rinse water contains about 0 to 5 wt %, based on the amount of rinse water, of at least one surfactant, more preferably about 0.02 to 2 wt %, most preferably about 0.05 to 0.5 wt %.

The rinse water containing the additives can be prepared by adding a suitable amount of the additive composition according to the invention to the rinse water or by adding a suitable amount of the additive concentrate according to the invention. The water used can be selected from the group consisting of tap water, well water, demineralized water and recirculated rinse water.

A person skilled in the art is able to select a suitable amount of the additive composition and additive concentrate, respectively and he/she is also able to select a suitable additive composition concentrate depending on the processor used, the type of water, type of developer and type of radiation-sensitive layer on the printing plate.

According to a preferred embodiment the rinse water is recirculated with a conventional water recycling system. By the use of the additive composition of the invention it is possible to re-use the rinse water several times without any decrease in the rinsing efficiency and/or any negative effect on the printing plate qualities. The amount of $m^2$ of plate which can be rinsed depends on the kind of developer used, the kind of plate to be rinsed and the additive composition. The rinse water can be recirculated and re-used until its pH value is about 9.5. A higher pH value deteriorates the plate and is therefore not suitable; by the buffering agent present in the additive composition of the invention the time until the pH of the rinse water reaches pH 9.5 is prolonged.

The plate obtained by the method according to the invention need not to be subjected to a subsequent gumming step. However, it is within the scope of the present application that the obtained plate is subjected to a subsequent gumming step.

The use of the additive composition and additive concentrate, respectively, provides the following advantages:

The additive composition in the rinse water leads to an absolutely clean development of plates, that means that all problems caused by developer drag-in (carry over) are inhibited. Plates are optimally prepared for press without the need for a further gumming step (hydrophilic properties, corrosion protection, pH-value).

If the circulation water is used to rinse off image remover (for example, a Sprinter 72iK water recycling system from Kodak Polychrome Graphics) all corrected image areas become hydrophilic again.

Scratches on the plate's surface become hydrophilic again.

The problem of algae and bacteria growth upon the effect of light or temperature or caused by prolonged bath life of the rinse water is prevented.

There are no deposits of calcium and magnesium salts, which may cause major problems on press (like blinding and toning).

Dragged-out alkaline developer components are neutralized so that there is no decrease in rinsing efficiency.

The anti-corrosive properties of the phosphonates and phosphates lead to a resealing of the plate surface upon rinsing, which is an optimum preparation for printing. The results are very good hydrophilic properties, excellent water-ink balance, fast roll-up on press and no toning.

The plate surface is additionally sealed and protected against fingerprints, etc. by the water-soluble film-forming resin. Dirt particles that may have been dragged-in are bound and cannot penetrate into the plate surface.

Any conventionally used processing equipment can be used for carrying out the method of the invention.

The following examples serve to provide a more detailed explanation of the invention without limiting it.

EXAMPLES

Additive Compositions

Two additive compositions according to the invention as well as one comparative composition were prepared by mixing the components in the desired amounts. The components of each composition as well as the amounts of all components are shown in Table 1.

TABLE 1

| Compound | Composition 1 wt % | Composition 2 wt % | Composition 3 wt % |
| --- | --- | --- | --- |
| DEQUEST ® 2000 [1] | 4.20 | 4.02 | — |
| DEQUEST ® 2006 [2] | 8.86 | 8.46 | 10 |
| MERGAL ® K6N [3] | 75.07 | — | 70.44 |
| Parmetol B70 [4] | — | — | 0.40 |
| PROXEL ® GXL [5] | — | 71.73 | 1.61 |
| PREVENTOL ® ON extra [6] | — | — | 0.24 |
| boric acid | — | 0.72 | 0.80 |
| TRITON ® GR5 [7] | 0.30 | — | — |
| DOWFAX ® 8390 [8] | — | 0.72 | 0.40 |
| dextrine | — | 14.34 | 16.09 |
| hydroxy ethyl cellulose | 11.55 | — | — |
| silicone antifoaming agent | 0.02 | 0.01 | 0.02 |
| Total | 100 | 100 | 100 |

[1] aminotris-(methylene-phosphonic acid) available from Brenntag, Germany
[2] aminotris-(methylene-phosphonic acid), sodium salt available from Brenntag, Germany
[3] N-methylole-chloroacetamide available from Honeywell, USA
[4] combination of bactericide and fungicide available from Schülke & Mayr GmbH, Germany
[5] 1,2-benzisothiazoline-3-on available from Zeneca Biocides, Manchester, UK
[6] sodium-2-phenyl-phenolate available from Bayer, Germany
[7] dioctyl sodium sulfosuccinate available from Union Carbide
[8] sodium n-hexadecyl diphenyloxide disulfonate available from Dow Aqueous Concentrates Aqueous concentrates of the invention were prepared by mixing each of compositions 1 to 3 with water (20° hardness). Additionally, a mixture of water and MERGAL® K9N was prepared for comparative reasons (concentrate 4). Details of the concentrates are summarized in Table 2.

TABLE 2

| Component | Concentrate 1 wt % | Concentrate 2 wt % | Concentrate 3 wt % | Concentrate 4 (Comparative) wt % |
| --- | --- | --- | --- | --- |
| Composition 1 | 66.6 | — | — | — |
| Composition 2 | — | 69.71 | — | — |
| MERGAL ® K9N* | — | — | — | 50 |
| Composition 3 | — | — | 62.16 | — |
| Water (demineralized)) | 33.4 | 30.29 | 37.84 | 50 |
| Total | 100 | 100 | 100 | 100 |

*isothiazolinone compounds available from Honeywell

Rinsing with Standard Water Recycling Unit a) Negative Working Lithographic Printing Plates Kodak Polychrome Graphics WINNER® plates were developed in a processor, type Sprinter 72 N of Kodak Polychrome Graphics, equipped with a standard water recycling system.

Processing speed: 80 cm/min.

The processor was filled with 30 liters of Kodak Polychrome Graphics Negative Developer 956 and 60 liters circulation water.

5% (based on the amount of circulation water; 3000 mL) of concentrates 1 to 4 and water with 20° hardness, respectively, were added to the circulation water.

5 m² printing plates were developed per liter rinse water.

b) Positive Working Lithographic Printing Plates

Kodak Polychrome Graphics Virage™ plates were developed in a processor, type Sprinter 72 N of Kodak Polychrome Graphics, equipped with a standard water recycling system.

The processor was filled with 30 liters of Kodak Polychrome Graphics Positive Developer 4030 and 60 liters circulation water.

The developer strength was kept constant by means of top up with developer 4030.

Processing speed: 100 cm/min.

5% (3000 mL) of concentrates 1 to 4 comparative concentrates and water with 20° hardness, respectively, were added to the circulation water.

5 m² printing plates were developed per liter rinse water.

c) Digital Newspaper Plates

Kodak Polychrome Graphics Thermal News™ plates were developed in a processor, type Sprinter 72 N of Kodak Polychrome Graphics, equipped with a standard water recycling system.

The processor was filled with 30 liters of Kodak Polychrome Graphics Developer 980 and 60 liters circulation water.

Processing speed: 80 cm/min.

5% (3000 mL) of concentrates 1 to 4 and water with 20° hardness, respectively, were added to the circulation water.

5 m² printing plates were developed per liter rinse water.

In the Kodak Polychrome Graphics processor Sprinter 72 N the developed printing plates a, b and c were thoroughly squeezed by rubber rollers and then rinsed by circulation Water.

Per m² plate about 10 to 12 L rinse water were used.

After rinsing with circulation water, plates were squeezed again by rubber rollers, dried with infrared and stored for 24 hours and put on press.

Printing Test with the Developed Plates

The printing plates obtained after the rinsing described above were mounted on a press and used for printing. The results are shown in Table 3.

TABLE 3

| ADDITIVE (5 wt % addition) | WINNER® developed with 956 | Virage ™ developed with 4030 | Thermal News ™ developed with 980 |
| --- | --- | --- | --- |
| Concentrate 1 | Ok | Ok | Ok |
| Concentrate 2 | Ok | Ok | Ok |
| Concentrate 3 | Ok | Ok | Ok |
| Concentrate 4 (comparison) | toning | toning | toning |
| Water with 20° hardness (comparison) | toning | toning | toning |

As apparent from the above table, no printing problems arise when recirculated rinse water that contains an additive composition according to the invention is used. Contrary thereto toning occurs during printing when the recirculated water does not contain any additive or contains an additive composition that is not according to the invention.

Rinsing with Water Recycling System iK and Print Test with the Developed Plates

Kodak Polychrome Graphics Virage™ plates were developed in a processor, type Sprinter 72 iK of Kodak Polychrome Graphics which is equipped with a water recycling system.

The processor was filled with 30 liters of Kodak Polychrome Graphics Positive Developer 4030 and 60 liters circulation water.

The developer strength was kept constant by means of top up with developer 4030.

Processing speed: 100 cm/min.

The developed and dried printing plates were corrected with the Kodak Polychrome Graphics Image Remover 243.

Plates were run through the second in-feed of the Sprinter 72N and the image remover was rinsed off by the water recycling system iK. Residues of the image remover that had been dragged in were filtered by a filter cloth. The corrected areas did not pick up ink on press. However, plates that had been rinsed with tap water showed toning in the corrected areas, which could only be removed by a subsequent treatment with plate cleaner.

As the water recycling system iK works with a high-pressure pump, the additive needs to have an antifoaming agent.

Although the invention has been particularly shown and described with reference to the preferred embodiments, those skilled in the art will appreciate that various modifications and changes in form and details may be made without departing from the spirit and scope of the invention. Having described the invention, we now claim the following and their equivalents.

What I claim:

1. A method for processing an imagewise exposed lithographic printing plate, the method comprising, in order, the steps of:

(i) applying a developer to the exposed plate; and (ii) rinsing the plate with rinse water;

in which the rinse water comprises:

(a) at least one water-soluble film-forming polymer;

(b) at least one compound selected from the group consisting of phosphoric acid derivatives of formula I

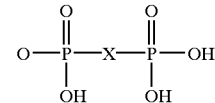

in which X is $C_2$–$C_6$ alkylene or

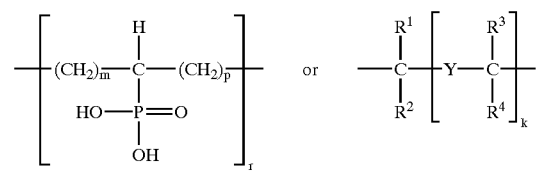

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is —$R^6$N—$(CH_2)_n$—$(NR^5)_q$—, in which q is 0 or 1, n is an integer from 0 to 8 and $R^5$ and $R^6$ are each independently H, $C_1$–$C_4$ alkyl, or —$CH_2$—$P(O)(OH)_2$.

2. The method of claim 1 in which the rinse water has a pH value of about 7 or below.

3. The method of claim 1 in which the rinse water comprises about 0.0004 to 8 wt % of the water-soluble film-forming polymer, based on the amount of rinse water.

4. The method of claim 1 in which the rinse water comprises about 0.0004 to 3 wt % of the phosphonic acid derivative, based on the amount of rinse water.

5. The method of claim 2 in which the rinse water comprises about 1 to 100 mmole of a pH regulating agent per liter of rinse water in which the pH regulating agent is selected from the group consisting of citric acid, citric acid salts, boric acid, acetic acid, propionic acid, succinic acid, phosphates, and phosphoric acid.

6. The method of claim 2 in which the rinse water is recirculated.

7. The method of claim 2 in which the rinse water additionally comprises at least one additive selected from the group consisting of antifoaming agents, biocides, corrosion inhibitors and surfactants.

8. The method of claim 7 in which the amount of the antifoaming agent in the rinse water is about 0.00002 to 0.5 wt % based on the amount of rinse water.

9. The method of claim 7 in which the amount of the biocide in the rinse water is about 0.12 to 8 wt % based on the amount of rinse water.

10. The method of claim 7 in which the amount of the corrosion inhibitor in the rinse water is about 0.004 to 1 wt % based on the amount of rinse water.

11. The method of claim 7 in which the rinse water comprises about 0.01% to 3 wt %, based on the amount of rinse water, of a chelating agent and in which the chelating agent is selected from the group consisting of aminopolycarboxylic acids and salts thereof; and 2-phosphonobutanetricarboxylic acid-1,2,4 and potassium, sodium, and organic amine salts thereof; 2-phosphonobutane-tricarboxylic acid-2,3,4 and potassium, sodium, and organic amine salts thereof; 1-phosphonoethane-tricarboxylic acid-2,2,2 and potassium, sodium, and organic amine salts thereof; sodium gluconate; and mixtures thereof.

12. The method of claim 7 in which the amount of the surfactant in the rinse water is about 0 to 5 wt % based on the amount of rinse water.

13. The method of claim 7 in which the rinse water is recirculated.

14. The method of claim 7 in which the rinse water is prepared by adding an additive composition to water selected from the group consisting of tap water, well water, demineralized water, and recirculated rinse water; the additive composition comprising the at least one water-soluble film-forming polymer, the at least one phosphonic acid derivative, the at least one additive, and at least one pH regulating agent capable of maintaining the pH value of an aqueous solution at about 7 or below.

15. The method of claim 1 in which the rinse water is prepared by adding an additive composition to water selected from the group consisting of tap water, well water, demineralized water, and recirculated rinse water; the additive composition comprising the at least one water-soluble film-forming polymer, and the at least one phosphonic acid derivative.

16. The method of claim 2 in which the rinse water is prepared by adding an additive composition to water selected from the group consisting of tap water, well water, demineralized water, and recirculated rinse water; the additive composition comprising the at least one water-soluble film-forming polymer, the at least one phosphonic acid derivative, and at least one pH regulating agent capable of maintaining the pH value of an aqueous solution at about 7 or below.

17. The method of claim 1 in which:
the rinse water is prepared by adding an aqueous concentrate to water selected from the group consisting of tap water, well water, demineralized water, and recirculated rinse water; and
the aqueous concentrate comprises about 40 to 90 wt % of an additive composition, based on the amount of water in the concentrate;
the additive composition comprising the at least one water-soluble film-forming polymer, and the at least one phosphonic acid derivative.

18. The method of claim 2 in which:
the rinse water is prepared by adding an aqueous concentrate to water selected from the group consisting of tap water, well water, demineralized water, and recirculated rinse water; and
the aqueous concentrate comprises about 40 to 90 wt % of an additive composition, based on the amount of water in the concentrate;
the additive composition comprising the at least one water-soluble film-forming polymer, the at least one phosphonic acid derivative, and at least one pH regulating agent capable of maintaining the pH value of an aqueous solution at about 7 or below.

19. The method of claim 2 in which the lithographic printing plate comprises a light-sensitive layer comprising a novolac resin and a radiation-sensitive component that is converted to a carboxylic acid on exposure to radiation.

20. The method of claim 16 in which:
the water-soluble film-forming polymer comprises about 5 to about 30 wt % of the additive composition, based on the total additive composition;
the pH regulating agent comprises about 0.01 to about 0.5 mol of the pH regulating agent per 100 g of the total additive composition;
the pH regulating agent is capable of keeping the pH of the aqueous composition in the range of about pH 5 to pH 6;
the at least one phosphonic acid derivative comprises about 3 to 20 wt % of the additive composition, based on the total additive composition; and
the additive composition comprises one or more additives selected from the group consisting of antifoaming agents, biocides, corrosion inhibitors, chelating agents and surfactants.

21. The method of claim 20 in which the phosphonic acid derivative is selected from the group consisting of hydroxyethanediphosphonic acid and salts thereof, hexamethylenediaminotetra(methylenephosphonic acid) and salts thereof, aminotris(methylenephosphonic acid) and salts thereof, and mixtures thereof.

22. The method of claim 21 in which the method does not comprise a gumming step.

23. The method of claim 1 in which the method does not comprise a gumming step.

24. The method of claim 2 in which the film-forming polymer is dextrine; in which the phosphonic acid derivative is selected from the group consisting of aminotris-(methylene-phosphonic acid), salts of aminotris-(methylene-phosphonic acid), and mixtures thereof; and in which the additive composition additionally comprises a biocide that is an isothiazoline derivative.

25. The method of claim 24 in which the isothiazoline derivative is 1,2-benzisothiazoline-3-one.

26. The method of 9 in which the film-forming polymer is dextrine; the phosphonic acid derivative is selected from the group consisting of aminotris-(methylene-phosphonic acid), salts of aminotris-(methylene-phosphonic acid), and mixtures thereof; and the biocide is an isothiazoline derivative.

27. The method of claim 26 in which the isothiazoline derivative is 1,2-benzisothiazoline-3-one.

28. The method of claim 2 in which the film-forming polymer is dextrine or hydroxy ethyl cellulose; and the phosphonic acid derivative is selected from the group consisting of aminotris-(methylene-phosphonic acid), salts of aminotris-(methylene-phosphonic acid), and mixtures thereof.

29. The method of claim 1 in which the film-forming polymer is dextrine, and the phosphoric acid derivative is aminotris-(methylene-phosphonic acid).

30. The method of claim 11 in which:

the film-forming polymer is dextrine, the phosphoric acid derivative is aminotris-(methylene-phosphonic acid), the additive is a biocide, the chelating agent is selected from the group consisting of ethylenediamine-tetraacetic acid and salts thereof, the rinse water additionally comprises an pH regulating agent, and the pH regulating agent is boric acid.

* * * * *

UNITED STATES PATENT AND TRADEMARK OFFICE
CERTIFICATE OF CORRECTION

PATENT NO. : 6,660,454 B2  Page 1 of 1
APPLICATION NO. : 10/272762
DATED : December 9, 2003
INVENTOR(S) : Fiebag It is certified that error appears in the above-identified patent and that said Letters Patent is hereby corrected as shown below:

On the Title Page

In the Abstract
delete " 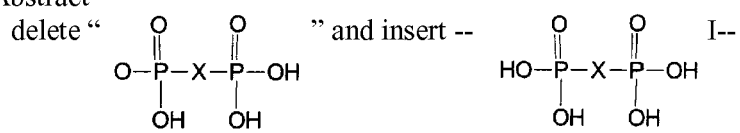 " and insert -- ... --, and delete the second instance of
" 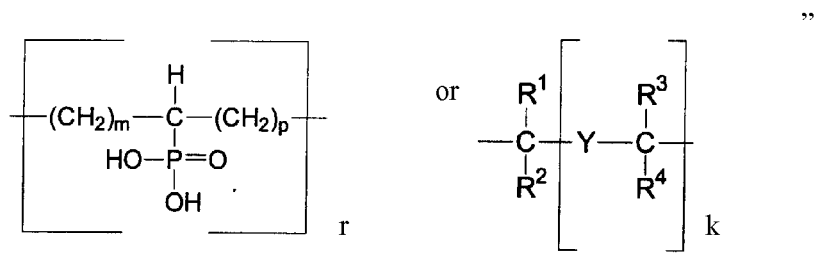 "

In the Claims

Column 10, lines 43-49,
delete " 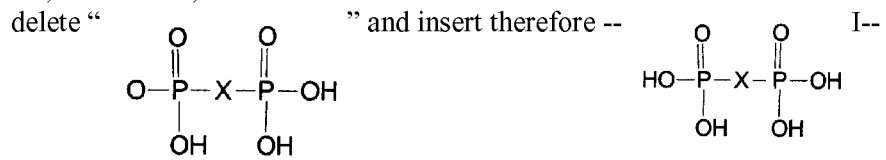 " and insert therefore -- ... --.

Signed and Sealed this

Eighteenth Day of March, 2008

JON W. DUDAS
*Director of the United States Patent and Trademark Office*